(12) United States Patent
Tange et al.

(10) Patent No.: US 11,990,490 B2
(45) Date of Patent: May 21, 2024

(54) PHOTOELECTRIC CONVERSION APPARATUS AND EQUIPMENT

(71) Applicant: CANON KABUSHIKI KAISHA, Tokyo (JP)

(72) Inventors: Tsutomu Tange, Kanagawa (JP); Toshiyuki Ogawa, Chiba (JP); Hideaki Ishino, Tokyo (JP); Yusuke Onuki, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 268 days.

(21) Appl. No.: 17/222,743

(22) Filed: Apr. 5, 2021

(65) Prior Publication Data
US 2021/0313369 A1    Oct. 7, 2021

(30) Foreign Application Priority Data

Apr. 7, 2020 (JP) .................................. 2020-069428

(51) Int. Cl.
*H01L 27/146* (2006.01)

(52) U.S. Cl.
CPC .. *H01L 27/14623* (2013.01); *H01L 27/14621* (2013.01); *H01L 27/14627* (2013.01); *H01L 27/14636* (2013.01); *H01L 27/1464* (2013.01); *H01L 27/14645* (2013.01)

(58) Field of Classification Search
CPC ......... H01L 27/14623; H01L 27/14636; H01L 27/1464; H01L 27/14645
See application file for complete search history.

(56) References Cited

U.S. PATENT DOCUMENTS

| | | | | |
|---|---|---|---|---|
| 5,576,239 A | * | 11/1996 | Hatano | H01L 31/02164 438/69 |
| 7,511,324 B2 | * | 3/2009 | Unagami | H01L 27/14623 257/292 |
| 2008/0308149 A1 | * | 12/2008 | Nomura | C07D 209/60 548/455 |
| 2010/0201834 A1 | * | 8/2010 | Maruyama | H01L 27/1464 257/E31.127 |
| 2017/0338265 A1 | * | 11/2017 | Yoshiba | H04N 25/76 |
| 2020/0119099 A1 | * | 4/2020 | Shibuta | H01L 27/14665 |
| 2021/0273017 A1 | * | 9/2021 | Murata | H01L 27/1462 |

FOREIGN PATENT DOCUMENTS

| | | |
|---|---|---|
| JP | H07202160 A | 8/1995 |
| JP | H07326725 A | 12/1995 |
| JP | 2010186818 A | 8/2010 |
| JP | 2012191005 A | 10/2012 |
| JP | 2018078281 A | 5/2018 |
| JP | 2019200399 A | 11/2019 |
| WO | 2014136738 A | 9/2014 |
| WO | 2016114154 A | 7/2016 |

* cited by examiner

*Primary Examiner* — Yara B Green
*Assistant Examiner* — Fakeha Sehar
(74) *Attorney, Agent, or Firm* — CANON U.S.A., INC. IP Division

(57) ABSTRACT

A technique advantageous for improving an optical property of a photoelectric conversion apparatus is provided. The photoelectric conversion apparatus includes a photoelectric conversion layer and a light-shielding film that covers the photoelectric conversion layer, wherein the light-shielding film includes one metallic layer and another metallic layer located between the one metallic layer and the photoelectric conversion layer.

32 Claims, 6 Drawing Sheets

US 11,990,490 B2

PHOTOELECTRIC CONVERSION APPARATUS AND EQUIPMENT

BACKGROUND OF THE INVENTION

Field of the Disclosure

The present disclosure relates to an photoelectric conversion apparatus.

Description of the Related Art

A light-shielding film is provided in a light-receiving area and a light-shielding area of a photoelectric conversion apparatus. According to a technique discussed in Japanese Patent Application Laid-Open No. 2010-186818, a light-shielding film is formed of a film made of aluminum (Al), tungsten (W), or copper (Cu).

With the technique discussed in Japanese Patent Application Laid-Open No. 2010-186818, the light-shielding film does not have a sufficient optical property. Therefore, the present invention is directed to a technique advantageous for improving the optical property of the photoelectric conversion apparatus.

SUMMARY

According to an aspect of the present disclosure, a photoelectric conversion apparatus includes a photoelectric conversion layer and a light-shielding film configured to cover the photoelectric conversion layer, wherein the light-shielding film includes a first metallic layer and a second metallic layer located between the first metallic layer and the photoelectric conversion layer, and wherein the following conditional expression is satisfied: $((Na-1)^2+Ka^2)/((Na+1)^2+Ka^2)>((Nb-1)^2+Kb^2)/((Nb+1)^2+Kb^2)$ and $Kb \times Tb \geq 0.183 \times \lambda b$, where Na is a refractive index of the first metallic layer, Ka is an extinction coefficient of the first metallic layer, Nb is a refractive index of the second metallic layer, Kb is an extinction coefficient of the second metallic layer, Tb is a thickness of the second metallic layer, and λb is a wave length of light incident on the second metallic layer.

According to another aspect of the present disclosure, a photoelectric conversion apparatus includes a photoelectric conversion layer and a light-shielding film configured to cover the photoelectric conversion layer, wherein the light-shielding film includes a first metallic layer and a second metallic layer located between the first metallic layer and the photoelectric conversion layer, wherein a principal component of the first metallic layer is aluminum, and wherein a principal component of the second metallic layer is tungsten.

Further features of the present invention will become apparent from the following description of exemplary embodiments with reference to the attached drawings.

DESCRIPTION OF THE EMBODIMENTS

Figure 1A:
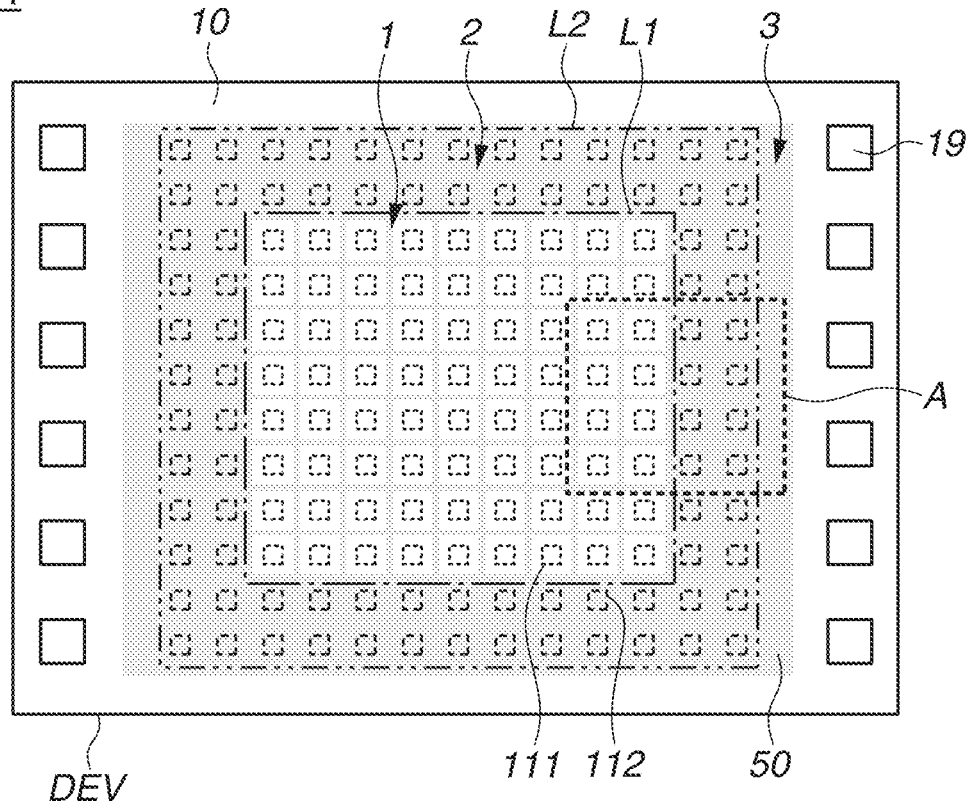
FIGS. 1A and 1B are schematic diagrams illustrating a photoelectric conversion apparatus and an equipment.

Hereinafter, an exemplary embodiment embodying the present invention will be described with reference to the appended drawings. In the below-described exemplary embodiment and drawings, a common reference numeral is applied to a constituent element common to a plurality of drawings. Therefore, the common constituent element will be described with reference to the plurality of drawings, and description of a constituent element having a common reference numeral will be omitted as appropriate.

Figure 1B:
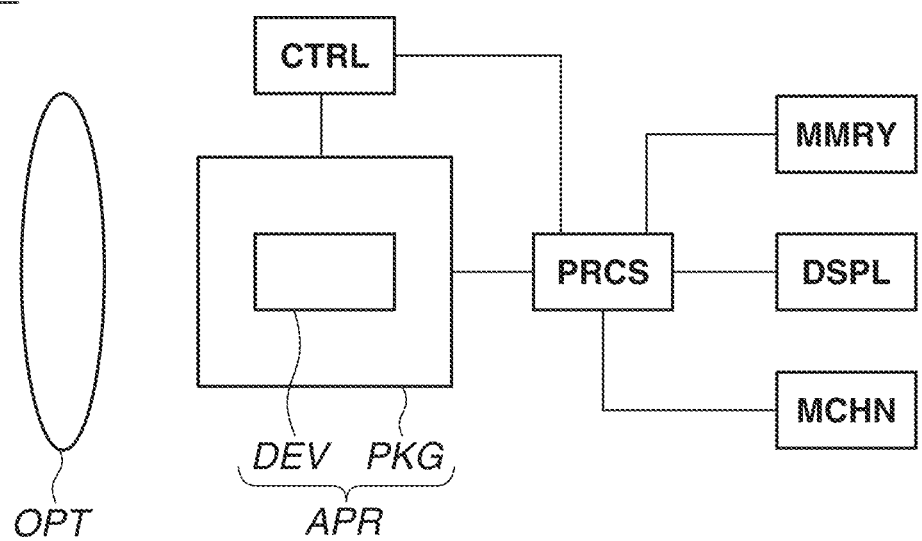
Figure 2:
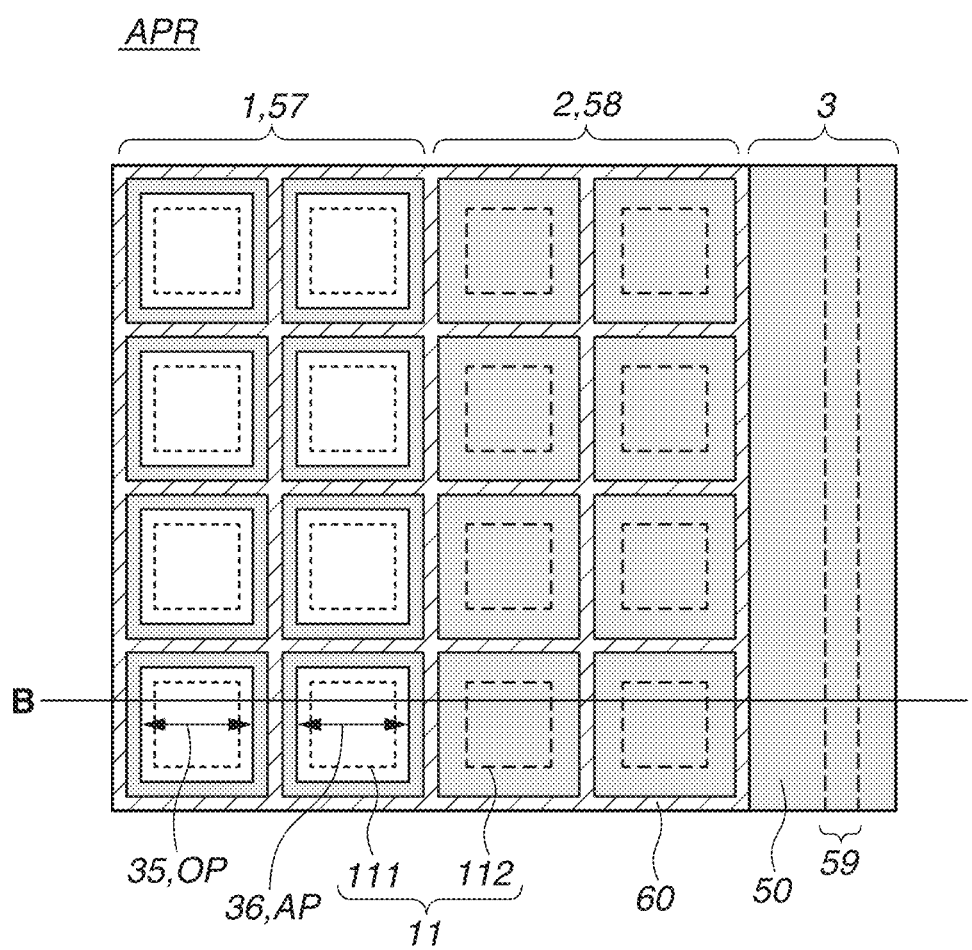
FIG. 2 is a schematic plan view illustrating the photoelectric conversion apparatus.
Figure 3:
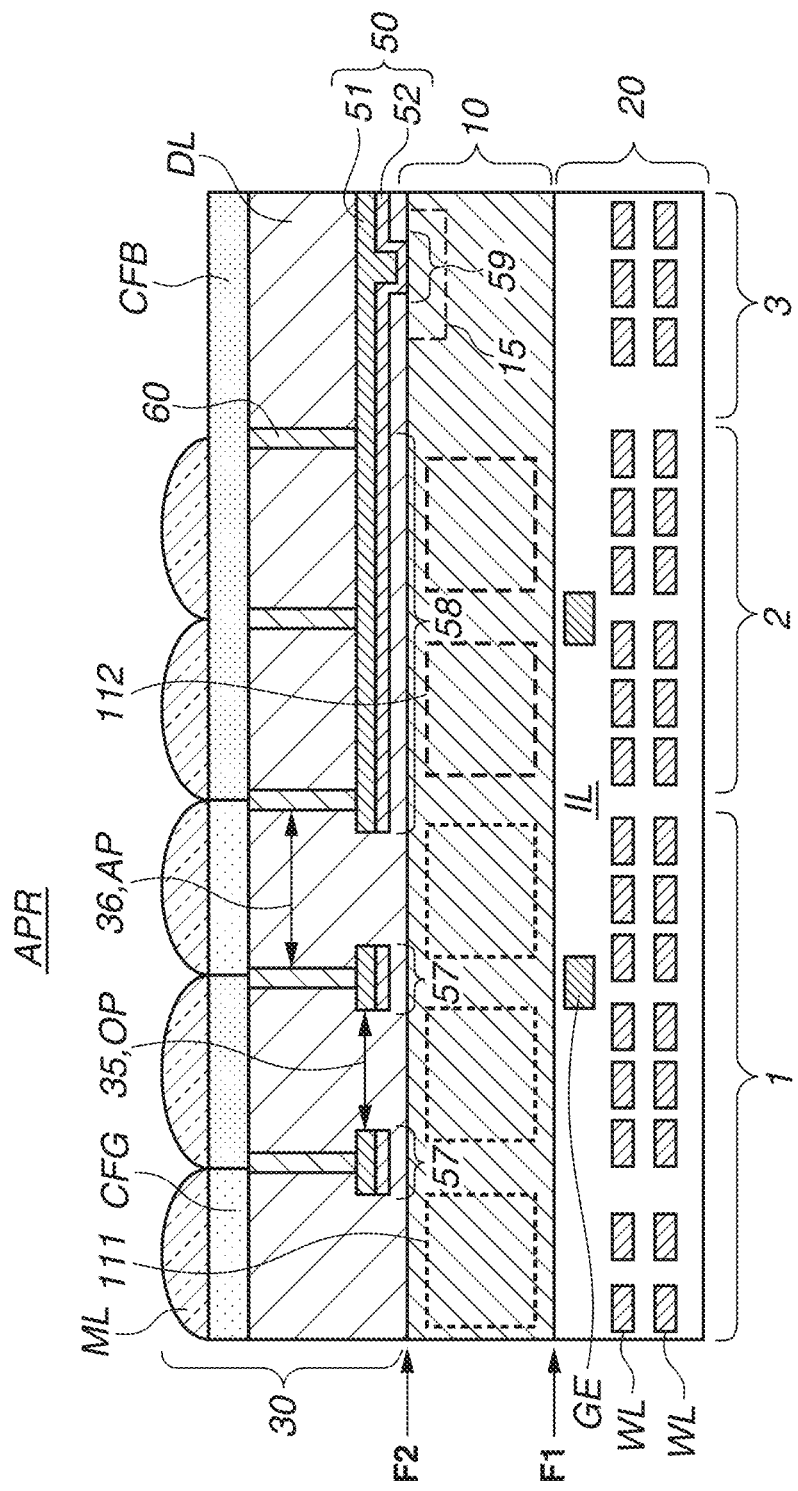
FIG. 3 is a schematic cross-sectional diagram illustrating the photoelectric conversion apparatus.

FIG. 1A is a schematic diagram illustrating a plan view of a photoelectric conversion apparatus APR. FIG. 1B is a schematic diagram illustrating an equipment EQP including the photoelectric conversion apparatus APR. FIG. 2 is a schematic plan view of the photoelectric conversion apparatus APR illustrating details of a portion indicated by an area A in FIG. 1A. FIG. 3 is a schematic cross-sectional diagram of the photoelectric conversion apparatus APR illustrating a portion indicated by a line B in FIG. 2.

As illustrated in FIGS. 1A, 2, and 3, the photoelectric conversion apparatus APR includes a light-receiving pixel area 1 and a light-shielding pixel area 2. In FIG. 1A, the light-receiving pixel area 1 is a range surrounded by a dashed-dotted line L1, and the light-shielding pixel area 2 is a range surrounded by the dashed-dotted line L1 and a dashed-double-dotted line L2. The light-receiving pixel area 1 and the light-shielding pixel area 2 are collectively called a pixel area. A peripheral area 3 is a range outside of the dashed-double-dotted line L2. A light-shielding film 50 is provided in at least the light-shielding pixel area 2. In the present exemplary embodiment, the light-shielding film 50 is also provided in the light-receiving pixel area 1. The light-shielding film 50 is also provided in the peripheral area 3. The light-shielding film 50 of the present exemplary embodiment includes a plurality of openings OP in the light-receiving pixel area 1. A photoelectric conversion layer 10 can receive light via the openings OP. The light-shielding film 50 includes a light-receiving pixel portion 57 located in the light-receiving pixel area 1, a light-shielding pixel portion 58 located in the light-shielding pixel area 2, and a portion located in the peripheral area 3. Thicknesses of the light-receiving pixel portion 57 and the light-shielding pixel portion 58 may or may not be the same. The portion located in the peripheral area 3 includes a connection portion 59. Each of the openings OP is surrounded by the light-receiving pixel portion 57. The light-shielding pixel portion 58 covers a plurality of photoelectric conversion portions 112. Electrodes 19 are arranged in the peripheral area 3 of a device DEV. Each of the electrodes 19 can be a bonding pad to which a bonding wire included in the photoelectric conversion apparatus APR is connected. The electrodes 19 are exposed from pad openings provided in the photoelectric conversion layer 10, so that bonding wires can be arranged within the pad openings.

As mainly illustrated in FIG. 3, the photoelectric conversion apparatus APR includes a photoelectric conversion layer 10 and a light-shielding film 50 that covers the photoelectric conversion layer 10. The photoelectric conversion layer 10 includes a front surface F1 and a back surface F2. A plurality of photoelectric conversion portions 11 are arrayed in a portion between the front surface F1 and the back surface F2 of the photoelectric conversion layer 10. From among the plurality of photoelectric conversion portions 11, photoelectric conversion portions 111 located in the light-receiving pixel area 1 constitute light-receiving pixels, whereas photoelectric conversion portions 112 located in the light-shielding pixel area 2 constitute light-shielding pixels. The photoelectric conversion portions 111 and 112 are simply described as the photoelectric conversion portions 11 in a case where it is not necessary to distinguish one from another.

The light-receiving pixel area 1 includes an area where light-receiving pixels including the photoelectric conversion portions 111 are arranged in a matrix state. Signals of the light-receiving pixels arrayed in each column in the light-receiving pixel area 1 are output through a column signal line (not illustrated). The light-shielding pixel area 2 includes an area where light-shielding pixels including the photoelectric conversion portions 112 are arranged in a matrix state. The light-shielding pixels can be optical black (OB) pixels used for detecting a black level. A buffer area including a pixel structure may be arranged between the light-receiving pixel area 1 and the light-shielding pixel area 2. Pixel signals of the light-receiving pixel area 1 and the light-shielding pixel area 2 are output through a row selection circuit, a read-out circuit, and a column selection circuit arranged in the peripheral area 3. The row selection circuit selects a row from the above-described pixel matrix and drives pixels in the selected row. Pixel signals of the row selected by the row selection circuit are output to the read-out circuit through column signal lines. The column selection circuit sequentially selects and outputs the plurality of signals read from the plurality of column signal lines by the read-out circuit.

The photoelectric conversion apparatus APR includes a wiring structure 20 arranged on one side (i.e., front surface F1) of the photoelectric conversion layer 10 opposite to a side on which the light-shielding film 50 is arranged. The wiring structure 20 includes a plurality of wiring layers WL and an insulating body IL in a periphery thereof. The insulating body IL includes a plurality of interlayer insulation layers. The photoelectric conversion apparatus APR includes an optical structure 30 arranged on a light incident side (i.e., back surface F2) of the photoelectric conversion layer 10. The light-shielding film 50 is a part of the optical structure 30. The photoelectric conversion layer 10 is arranged between the light-shielding film 50 and the wiring structure 20. The optical structure 30 includes a dielectric body DL, a color filter located on the dielectric body DL, and a microlens ML located on the color filter in addition to the light-shielding film 50. The optical structure 30 may include an intra-layer lens (not illustrated) arranged between the color filter and the photoelectric conversion layer 10. The optical structure 30 may include a light-shielding wall 60 arranged on the upper side of the light-shielding film 50. In the light-receiving pixel area 1, the light-shielding film 50 determines a light-transmission portion 35 consisting of the dielectric body DL, and a shape of the light-transmission portion 35 conforms to a shape of the opening OP.

The photoelectric conversion apparatus APR of the present exemplary embodiment is a back-face illumination type photoelectric conversion apparatus APR. However, the present exemplary embodiment is also applicable to a front-face illumination type photoelectric conversion apparatus APR. In the front-face illumination type photoelectric conversion apparatus APR, the wiring structure 20 is arranged between the light-shielding film 50 and the photoelectric conversion layer 10, or alternatively, the light-shielding film 50 is arranged between the wiring structure 20 and the photoelectric conversion layer 10.

Figure 6:
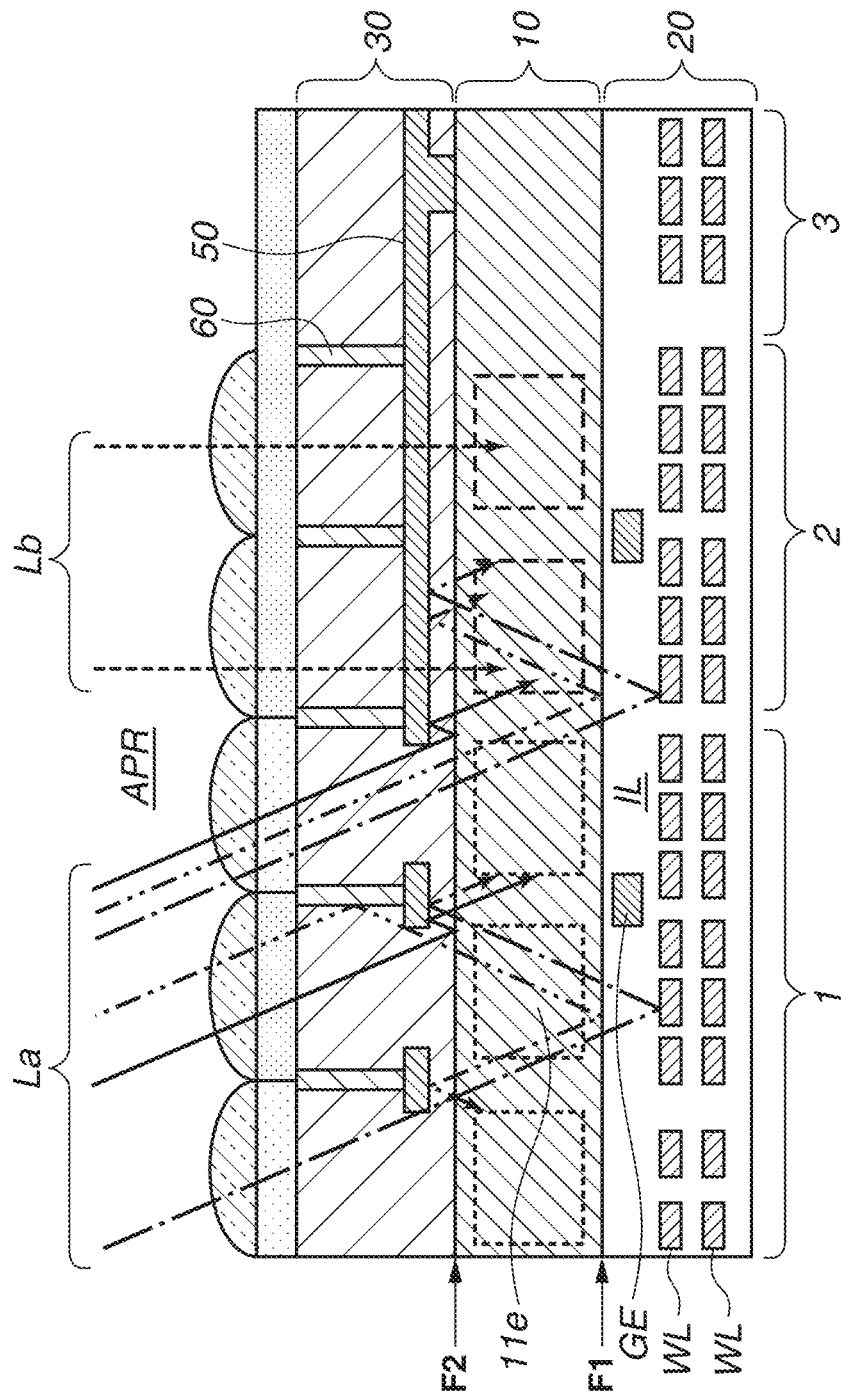
FIG. 6 is a schematic cross-sectional diagram illustrating a photoelectric conversion apparatus.

FIG. 6 is a cross-sectional diagram illustrating a reference embodiment of the photoelectric conversion apparatus APR, and the photoelectric conversion apparatus APR according to the reference embodiment has a structure similar to the structure illustrated in FIG. 3. In the reference embodiment, examples of reflection light La, i.e., light incident on the photoelectric conversion apparatus APR and reflected on the back surface F2 of the photoelectric conversion layer 10, light incident on the photoelectric conversion apparatus APR and reflected on the front surface F1 of the photoelectric conversion layer 10, and light incident on the photoelectric conversion apparatus APR and reflected on the wiring layer WL, are illustrated. The reflection light La is further reflected on a lower face (i.e., one face on a side of the photoelectric conversion layer 10) of the light-shielding film 50 again, and incident on the photoelectric conversion layer 10. Further, in the reference embodiment, transmitted light Lb, i.e., light that is incident on the photoelectric conversion apparatus APR, transmitted through the light-shielding film 50, and incident on the photoelectric conversion layer 10, is illustrated as an example. When light is reflected on the lower face of the light-shielding film 50 again, crosstalk is likely to occur in the pixels in the light-receiving pixel area 1. Further, the reflection light La and the transmitted light Lb may have an influence on the output of the light-shielding pixels because the reflection light La and the transmitted light Lb are received by the photoelectric conversion portions 112 that have to be shielded from light. For example, change in the output of the light-shielding pixels causes rise in the black level, and this may cause lowering of imaging performance. Furthermore, electric charges generated in the light-shielding pixel area 2 through photoelectric conversion may have an influence on the output of the light-receiving pixels. As described above, the imaging performance will be lowered if the light-shielding film 50 does not have a sufficient optical property. Therefore, in the present exemplary embodiment, the optical property of the light-shielding film 50 is improved by adopting a characteristic structure to the light-shielding film 50. In other words, a laminate structure which includes a layer for ensuring light-shielding capability of the light-shielding film 50 and a layer for suppressing reflection on the lower face of the light-shielding film 50 is adopted to the light-shielding film 50.

The light-shielding film 50 includes a metallic layer 51 and a metallic layer 52 located between the metallic layer 51 and the photoelectric conversion layer 10. The metallic layer 51 and the metallic layer 52 contain different principal components. Materials of the metallic layers 51 and 52 can be selected from various metals. Typically, materials selected from a group of materials such as tungsten, tantalum, titanium, nickel, cobalt, gold, silver, copper, and aluminum can be used.

Figure 5:
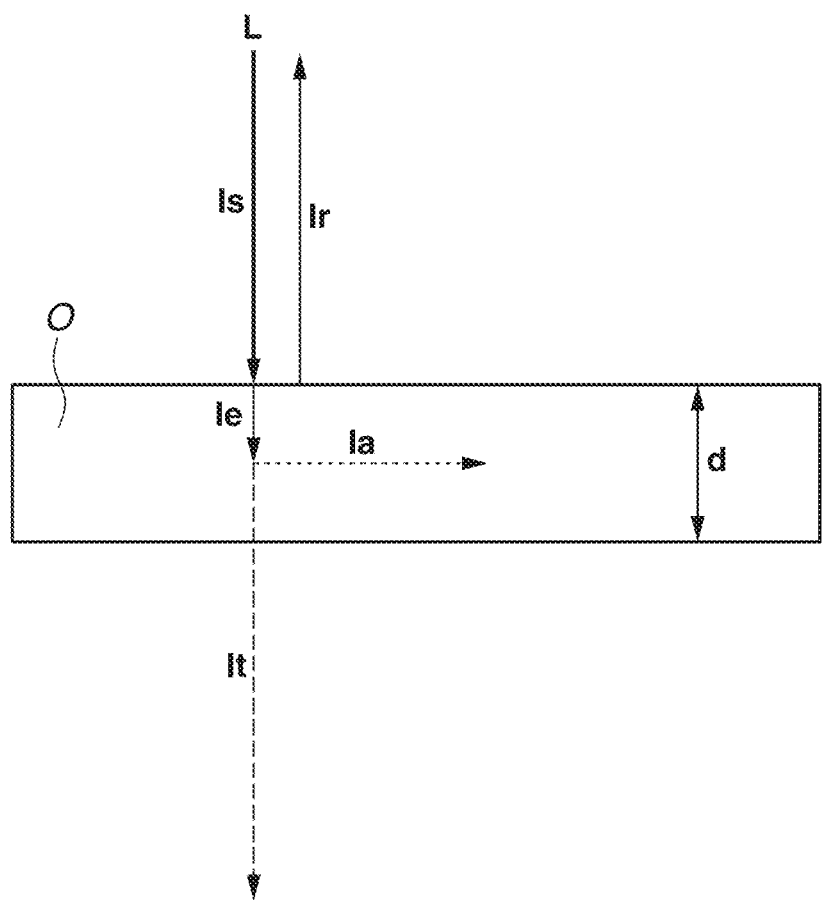
FIG. 5 is a schematic diagram illustrating a light absorption coefficient and a light transmission rate.

Hereinafter, a relationship between the structure and the optical property of the light-shielding film 50 will be described with reference to FIG. 5. Herein, a target object on which light L is incident is described as an object O. The object O can be replaced with the light-shielding film 50 when the light reflection rate, the light absorption rate, and the light transmission rate of the light-shielding film 50 are discussed.

The object O consists of a material M. A study will be conducted on a thickness d (nm) of the object O, a refractive index n of the material M, and an extinction coefficient k of the material M. The refractive index n and the extinction coefficient k are values with respect to a wavelength $\lambda$ (nm) of incident light L.

The light L is perpendicularly incident on the front surface of the object O. Reflection of light occurs on the front surface of the object O. A reflection rate of light reflected on the front surface of the object O is defined as a light reflection rate R. A relationship among the light reflection rate R, the refractive index n of the material M, and the extinction coefficient k of the material M is expressed by the following formula.

$$R=((n-1)^2+k^2)/((n+1)^2+k^2) \quad \text{Formula (i)}$$

The light that is not reflected thereon enters the inner portion of the object O from the front surface, so that absorption of light occurs in the inner portion of the object O. The light absorption rate of light absorbed in the inner portion of the object O with respect to light entering the inner portion of the object O is defined as a light absorption rate A. Light that is not absorbed in the inner portion of the object O is transmitted through the object O. A transmission rate of light transmitted through the object O with respect to light incident on the front surface of the object O is defined as a light transmission rate $\tau$.

Intensity of light L travelling toward the object O, intensity of light reflected on the object O from among the light L, and intensity of light entering the object O from among the light L are expressed as Is, Ir, and Ie, respectively. From among the light that enters the object O, intensity of light absorbed by the object O is expressed as Ia, and intensity of light transmitted through the object O is expressed as It. Relationships among the intensities Is, Ir, Ie, Ia, and It, the light reflection rate R, the light transmission rate $\tau$, and the light absorption rate A can be expressed as follows, and a formula (ii) can be derived therefrom.

$$Is=Ir+Ie$$

$$Ie=Ia+It$$

$$Ir=Is \times R$$

$$Ie=Is \times (1-R)$$

$$Ia=Ie \times A$$

$$It=Ie \times (1-A)$$

$$It=Is \times \tau$$

$$\tau=It/Is=(1-R) \times (1-A) \quad \text{Formula (ii)}$$

The intensity It of transmitted light and the light absorption rate A can be expressed by a distance d from a light incident portion to a light output portion of light in the inner portion of the object O and the light absorption coefficient $\alpha$ of the material M constituting the object O. A relationship between the light absorption coefficient $\alpha$ and the extinction coefficient k is expressed by the following formula.

$$It=Ie \times \exp[-\alpha \times d]$$

$$A=(Ie-It)/Ie=1-\exp[-\alpha \times d]$$

$$\alpha=4\pi \times k/\lambda$$

$$A=1-\exp[-4\pi \times k \times d/\lambda] \quad \text{Formula (iii)}$$

When the material M is determined, the light absorption rate A depends on the distance D. In a case where the light L is perpendicularly incident on the front surface of the object O when the front surface and the back surface of the object O are parallel to each other, the distance d corresponds to a distance between the front surface and the back surface, i.e., a thickness d of the object O.

It can be said that the light-shielding film 50 has a higher light-shielding capability when the light transmission rate ti is lower. Using a metallic layer having a high reflection rate is effective for improving the light-shielding capability of the light-shielding film 50. Thus, a material having a high light reflection rate is used for the metallic layer 51. As illustrated in FIG. 6, if a material having a high light reflection rate is used for the lower face of the light-shielding film 50, reflection easily occurs in the lower face of the light-shielding film 50, so that the amount of light L incident on the photoelectric conversion layer 10 will be increased in the light-shielding pixel area 2. This makes the black level of the light-shielding pixel increased, so that performance of an image sensor will be lowered. Thus, a material having a low reflection rate is used for the metallic layer 52. the light reflection rate Rb of the metallic layer 52 only needs to be lower than the light reflection rate Ra of the metallic layer 51. In other words, the light reflection rates Ra and Rb only needs to satisfy the relationship "Ra>Rb".

A refractive index of the metallic layer 51 is expressed as Na, an extinction coefficient of the metallic layer 51 is expressed as Ka, a refractive index of the metallic layer 52 is expressed as Nb, an extinction coefficient of the metallic layer 52 is expressed as Kb, and a thickness of the metallic layer 51 is expressed as Tb. The reflection rate Ra(Rb) of the metallic layer 51(52) is expressed by substituting Na(Nb) and Ka(kb) for n and k in the formula (i) ("n=Na(Nb)" and "k=Ka(kb)").

$$Ra=((Na-1)^2+Ka^2)/((Na+1)^2+Ka^2)$$

$$Rb=((Nb-1)^2+Kb^2)/((Nb+1)^2+Kb^2)$$

Satisfying "Ra>Rb" means satisfying the following formula (R).

$$((Na-1)^2+Ka^2)/((Na+1)^2+Ka^2)>((Nb-1)^2+Kb^2)/((Nb+1)^2+Kb^2) \quad \text{Formula (R)}$$

Although the formula (i) is described with respect to the case where the light L is incident perpendicularly, incident angle dependence of the reflection rate in the metallic layer can be ignored. This is because incident angle dependence of the reflection rate of light incident on the metallic layer is less than that of light incident on the insulation body (dielectric body).

Even if the light reflection rate Rb of the metallic layer 52 is low, light transmitted through the metallic layer 52 is reflected on the metallic layer 51, transmitted through the metallic layer 52 again, and incident on the photoelectric conversion layer 10 if the light transmission rate $\tau$p of the metallic layer 52 is high. Thus, it is effective to increase a light absorption rate Ab of the metallic layer 52. Specifically, the light absorption rate Ab of the metallic layer 52 only needs to be 90% or more (Ab≥0.9). If 90% or more of light that has entered the metallic layer 52 can be absorbed by the metallic layer 52, light incident on the photoelectric conversion layer 10 can be sufficiently suppressed. If the light absorption rate Ab of the metallic layer 52 is 90% or more, even if 10% of light that has entered the metallic layer 52 is transmitted through the metallic layer 52, the transmitted light is reflected on the metallic layer 51 and the like, and 9% or more of the transmitted light is absorbed by the metallic layer 52. In other words, if the light absorption rate Ab of the metallic layer 52 is 90% or more, 99% or more of light that has entered the metallic layer 52 can be absorbed.

Herein, the wavelength λa of light incident on the metallic layer 51 and the wavelength λb incident on the metallic layer 52 can be different. For example, when a blue color filter CFB exists above the light-shielding film 50, light mainly incident on the metallic layer 51 is blue light. Accordingly, it is preferable that the wavelength λa of light used for evaluating the refractive index Na and the extinction coefficient Ka of the metallic layer 51 be a wavelength of blue color (e.g., wavelength 450±10 nm). Light incident on the metallic layer 52 is not easily absorbed by the photoelectric conversion layer 10 because the light may contain light that has been transmitted through the photoelectric conversion layer 10. For example, when the photoelectric conversion layer 10 is a silicon layer, light mainly incident on the metallic layer 52 is red light. Accordingly, it is preferable that the wavelength λb used for evaluating the refractive index Nb and the extinction coefficient Kb of the metallic layer 52 be a wavelength of red color (e.g., wavelength 630±10 nm). However, light incident on the metallic layer 51 is not limited to blue light, and light incident on the metallic layer 52 is not limited to red light. Thus, the refractive index Na and the extinction coefficient Ka of the metallic layer 51 and the refractive index Nb and the extinction coefficient Kb of the metallic layer 52 may be evaluated by a wavelength λc (e.g., wavelength 550±10 nm) of green light which is a wavelength between the wavelengths of blue light and red light.

The light absorption rate Ab of the metallic layer 52 is expressed by substituting Nb, Kb, Tb, and λb for n, k, d, and λ in the formula (iii) ("n=Nb", "k=Kb" "d=Tb", and "λ=λb"), and a condition that satisfies "Ab≥0.9" is expressed by the following formula (A).

$$Ab = 1 - \exp[-4\pi \times Kb \times Tb/\lambda b] \geq 0.9 \quad \text{Formula (A)}$$

A formula (A') can be acquired by transforming the formula (A), and a formula (A") can be acquired by applying concrete values of the Napier's constant e and a circumference ratio π to the formula (A').

$$\exp[4\pi \times Kb \times Tb/\lambda b] \geq 10 \quad \text{Formula (A')}$$

$$Kb \times Tb \geq 0.183 \times \lambda b \quad \text{Formula (A")}$$

In the table 1, the refractive index n and the extinction coefficient k for each wavelength band are illustrated with respect to four materials, i.e., aluminum (Al), tungsten (W), titanium (Ti), and Copper (Cu). Further, the light reflection rate R expressed by the formula (i) and the distance d (d≥0.183×λ/k) that satisfies "k×d≥0.183×λ" are illustrated in the table 1. In the table 2, the refractive index n and the extinction coefficient k for each wavelength band are illustrated with respect to four materials, i.e., silver (Ag), tantalum (Ta), nickel (Ni), and gold (Au). Further, the light reflection rate R expressed by the formula (i) and the distance d (d≥0.183×λ/k) that satisfies "k×d≥0.183×λ" are illustrated in the table 2. If a thickness Tb of the metallic layer 52 satisfies the distance d illustrated in the table 1 or 2, the metallic layer 52 has the light absorption rate Ab of 0.9 or more.

TABLE 1

|  | | Aluminum (Al) | Tungsten (W) | Titanium (Ti) | Copper (Cu) |
|---|---|---|---|---|---|
| Blue Light | | n = 0.6 | n = 3.3 | n = 1.7 | n = 1.2 |
| | | k = 5.0 | k = 2.5 | k = 2.3 | k = 2.4 |
| | | R = 0.9 | R = 0.5 | R = 0.6 | R = 0.5 |
| | | d ≥ 15 nm | d = 33 nm | d = 37 nm | d = 34 nm |

TABLE 1-continued

|  | | Aluminum (Al) | Tungsten (W) | Titanium (Ti) | Copper (Cu) |
|---|---|---|---|---|---|
| Green Light | | n = 1.0 | n = 3.5 | n = 1.9 | n = 1.0 |
| | | k = 6.7 | k = 2.7 | k = 2.6 | k = 2.6 |
| | | R = 0.9 | R = 0.5 | R = 0.5 | R = 0.6 |
| | | d ≥ 15 nm | d ≥ 37 nm | d ≥ 39 nm | d ≥ 39 nm |
| Red Light | | n = 1.4 | n = 3.6 | n = 2.2 | n = 0.2 |
| | | k = 7.6 | k = 2.9 | k = 2.9 | k = 3.4 |
| | | R = 0.9 | R = 0.5 | R = 0.5 | R = 0.9 |
| | | d ≥ 15 nm | d ≥ 40 nm | d ≥ 40 nm | d ≥ 40 nm |

TABLE 2

|  | | Silver (Ag) | Tantalum (Ta) | Nickel (Ni) | Gold (Au) |
|---|---|---|---|---|---|
| Blue Light | | n = 0.2 | n = 2.8 | n = 1.6 | n = 1.5 |
| | | k = 2.5 | k = 2.1 | k = 2.7 | k = 1.9 |
| | | R = 0.9 | R = 0.4 | R = 0.5 | R = 0.3 |
| | | d ≥ 33 nm | d ≥ 39 nm | d ≥ 31 nm | d ≥ 44 nm |
| Green Light | | n = 0.1 | n = 2.5 | n = 1.8 | n = 0.3 |
| | | k = 3.3 | k = 1.8 | k = 3.3 | k = 2.7 |
| | | R = 1.0 | R = 0.4 | R = 0.6 | R = 0.9 |
| | | d ≥ 30 nm | d ≥ 55 nm | d ≥ 31 nm | d ≥ 37 nm |
| Red Light | | n = 0.1 | n = 1.7 | n = 2.0 | n = 0.2 |
| | | k = 4.0 | k = 2.1 | k = 3.7 | k = 3.1 |
| | | R = 1.0 | R = 0.4 | R = 0.6 | R = 0.9 |
| | | d ≥ 29 nm | d ≥ 5.6 nm | d ≥ 31 nm | d ≥ 38 nm |

Aluminum and silver are materials suitable for the material of the metallic layer 51 because the light reflection rates R of Aluminum and silver are greater than the light reflection rates R of the other materials. Tungsten and tantalum are materials suitable for the material of the metallic layer 52 because the light reflection rates R of Tungsten and tantalum are lower than the light reflection rates R of aluminum and silver.

Titanium and nickel can be used as the material of the metallic layer 52 because they have low light reflection rates R. However, because titanium can easily occlude hydrogen, titanium has an unfavorable effect on hydrogen termination with respect to a dangling-bond on the back surface F2 of the photoelectric conversion layer 10. For example, if a titanium layer is provided in the light-shielding pixel portion 58 in the light-shielding pixel area 2, an amount of hydrogen supplied to the photoelectric conversion layer 10 is decreased, so that a difference between dark currents in the light-receiving pixel area 1 and the light-shielding pixel area 2 is increased because of a difference in the amounts of hydrogen supplied thereto. Therefore, a difference between the black levels in the light-receiving pixel area 1 and the light-shielding pixel area 2 is increased, so that an error occurring in black level correction is increased. Nickel may have an unfavorable electromagnetic effect on the device DEV because it has a ferromagnetic property. Thus, as a material used for the metallic layer 52, tungsten or tantalum is more favorable than titanium or nickel.

When red light is incident on the metallic layer 51, copper or gold can be used as the material of the metallic layer 51 because they have high light reflection rates with respect to red light. When blue light is incident on the metallic layer 52, copper or gold can be used as the material of the metallic layer 52 because they have low light reflection rates with respect to blue light. When green light is incident on the metallic layer 52, copper can be used as the material of the metallic layer 52 because it has a low light reflection rate with respect to green light. When green light is incident on the metallic layer 51, gold can be used as the material of the metallic layer 51 because it has a high light reflection rate with respect to green light.

With respect to any of blue light, green light and red light, the light absorption rate of 0.9 (90%) or more can be realized with any of aluminum, tungsten, titanium, copper, silver, nickel, and gold, if a thickness d is 50 nm or more. With respect to any of blue light, green light and red light, the light absorption rate of 0.9 (90%) or more can be realized with tantalum if a thickness d is 60 nm or more.

It is preferable that a principal component of the metallic layer 51 be aluminum or silver. Further, it is preferable that a principal component of the metallic layer 52 be tungsten or tantalum.

Figure 4A:
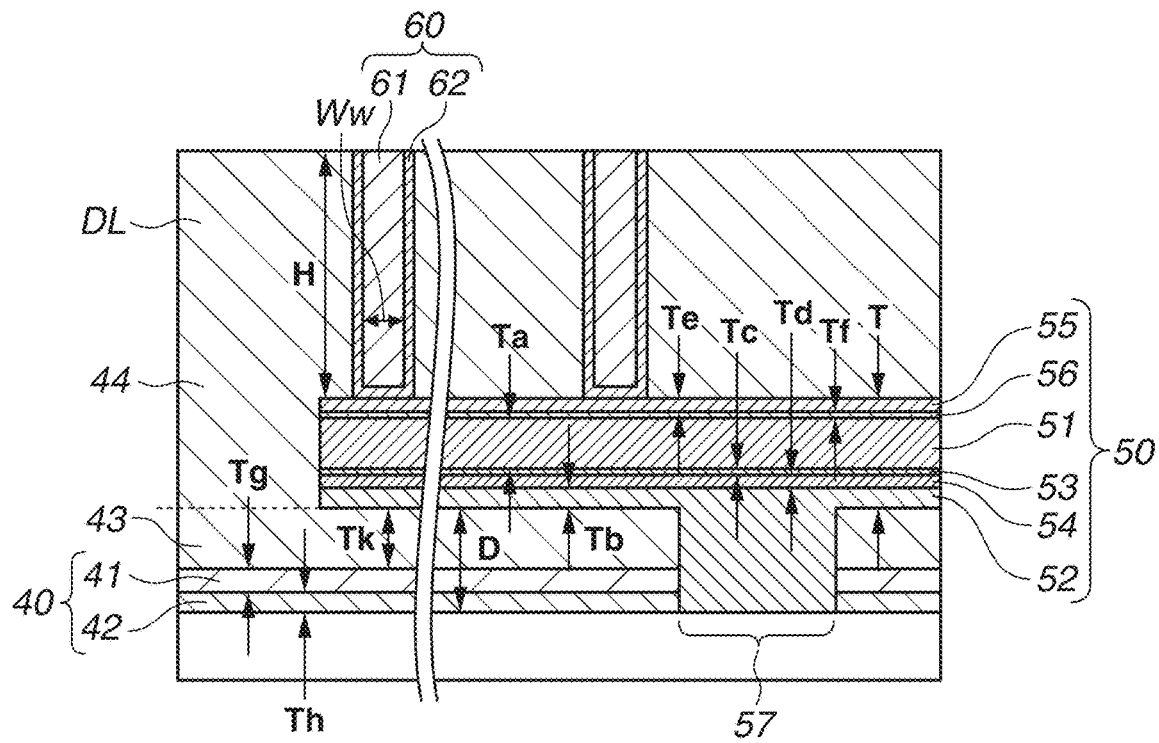
FIGS. 4A and 4B are schematic cross-sectional diagrams illustrating the photoelectric conversion apparatus.
Figure 4B:
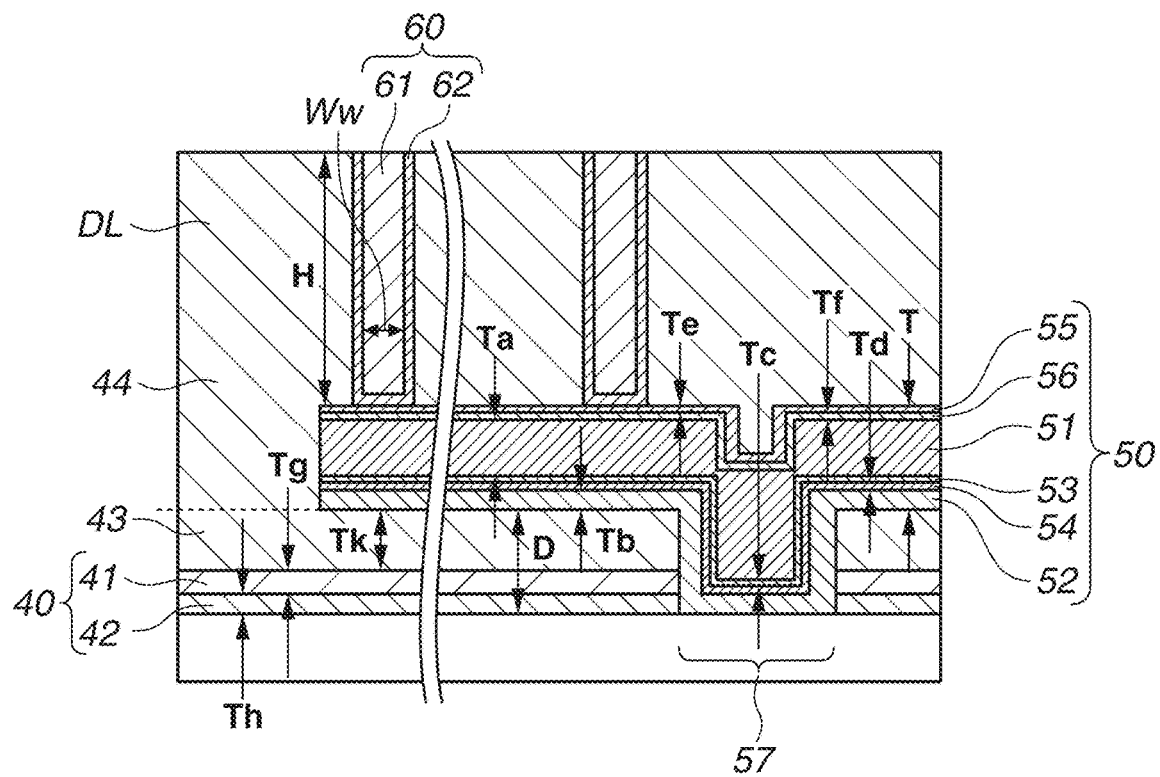

The light-shielding film 50 will be described in detail with reference to FIGS. 4A and 4B. The light-shielding film 50 is a laminated film including the metallic layers 51 and 52. It is preferable that the thickness Ta of the metallic layer 51 be greater than the thickness Tb of the metallic layer 52. For example, it is assumed that light-shielding capability required in the light-shielding pixel area 2 is −200 db or more. This corresponds to the light transmission rate $\tau$ of $10^{-10}$ or less. Accordingly, improving the light reflection rate R is not sufficient to realize this light-shielding capability. From the formula $\tau=(1-R)\times(1-A)$, it is found that the light absorption rate A has to be increased. As described above, in order to increase the light absorption rate A, the extinction coefficient k has to be greater and the thickness d has to be greater. The light-shielding capability of −200 db or more can be realized by making a thickness of a metallic layer primarily containing aluminum so as to be 150 nm or more. Although equivalent light-shielding capability can also be realized by making a thickness of a metallic layer primarily containing tungsten so as to be 370 nm or more, it is obvious that a thickness of the light-shielding film 50 will be increased. By using a metallic layer containing a material having a greater extinction coefficient k, the thickness T of the light-shielding film 50 can be reduced. A material having a greater extinction coefficient k only need to be used so that the light-shielding capability of the light-shielding film 50 can be improved while suppressing increase in the thickness T of the light-shielding film 50. It is preferable that the extinction coefficient Ka of the metallic layer 51 be greater than the extinction coefficient Kb of the metallic layer 52 (Ka>Kb). In a case where the extinction coefficient Kb of the metallic layer 52 is less than the extinction coefficient Ka of the metallic layer 51, it is preferable that the thickness Tb of the metallic layer 52 and the thickness Ta of the metallic layer 51 satisfy the relationship "Tb<Ta". In this way, the film thickness T of the light-shielding film 50 having a laminated structure can be reduced while improving the light-shielding capability of the light-shielding film 50 in the light-shielding pixel area 2. With this configuration, light reflected on a side wall of the light-shielding film 50 can be suppressed. The thickness Ta of the metallic layer 51 can be 50 nm or more. If the metallic layer 51 has the thickness Ta of 50 nm or more, the transmission rate of the metallic layer 51 becomes sufficiently low by using any metallic material. In a case where a material included in the above-described typical materials is used as the metallic layer 51, the transmission rate can be reduced to 10% or less if the metallic layer 51 has the thickness Ta of 50 nm. For example, the thickness Ta of the metallic layer 51 is 100 to 300 nm. The thickness Tb of the metallic layer 52 can be 50 nm or more. If the metallic layer 52 has the thickness Tb of 50 nm or more, the transmission rate of the metallic layer 52 becomes sufficiently low by using any metallic material. In a case where a material included in the above-described typical materials is used as the metallic layer 52, the transmission rate $\tau b$ can be reduced to 10% or less if the metallic layer 52 has the thickness Tb of 50 nm. For example, the thickness Tb of the metallic layer 52 is 50 to 150 nm.

The light-shielding film 50 may include a metallic compound layer 53 provided between the metallic layer 51 and the metallic layer 52. It is preferable that the thickness Tb of the metallic layer 52 be greater than a thickness Tc of the metallic compound layer 53. A principal component of the metallic compound layer 53 can be selected from various types of metallic compound such as metallic nitride, metal oxide, and metal carbide. Typically, a principal component of the metallic compound layer 53 is titanium nitride or tantalum nitride. In the present exemplary embodiment, a principal component of the metallic compound layer 53 is titanium nitride.

The light-shielding film 50 may include a metallic layer 54 arranged between the metallic layer 51 and the metallic layer 52. In the present exemplary embodiment, although the metallic layer 54 is provided between the metallic compound layer 53 and the metallic layer 52, the metallic layer 54 may be provided between the metallic compound layer 53 and the metallic layer 51. Typically, a principal component of the metallic layer 54 is titanium or tantalum. A thickness Td of the metallic layer 54 may be less than the thickness Tc of the metallic compound layer 53.

The light-shielding film 50 may include a metallic compound layer 55 provided on one side of the metallic layer 51 opposite to a side on which the photoelectric conversion layer 10 is provided. It is preferable that the thickness Ta of the metallic layer 51 be greater than a thickness Te of the metallic compound layer 55. It is preferable that a distance D between the light-shielding film 50 and the photoelectric conversion layer 10 be less than the thickness T of the light-shielding film 50. It is also preferable that the distance D between the light-shielding film 50 and the photoelectric conversion layer 10 be greater than the thickness Tb of the metallic layer 52.

The light-shielding film 50 may include a metallic layer 56 provided on one side of the metallic layer 51 opposite to a side on which the photoelectric conversion layer 10 is provided. In the present exemplary embodiment, although the metallic layer 56 is provided between the metallic layer 51 and the metallic compound layer 55, the metallic compound layer 55 may be provided between the metallic layer 51 and the metallic layer 56. Typically, a principal component of the metallic layer 56 is titanium or tantalum. A thickness Tf of the metallic layer 56 may be less than the thickness Te of the metallic compound layer 55.

The metallic compound layer 53, the metallic layer 54, the metallic compound layer 55, or the metallic layer 56 can function as a barrier layer. A material functioning as the barrier layer is selected depending on a combination of materials which constitute the metallic layers 51 and 52. When different materials are used for the metallic layers 51 and 52, providing a barrier layer between the metallic layers 51 and 52 is useful for stabilizing the connection between the metallic layers 51 and 52. The metallic compound layer 53 containing titanium nitride and the metallic layer 54 containing titanium can be provided as barrier layers when the metallic layer 51 contains aluminum and the light-shielding wall 60 contains tungsten.

From a side on which the photoelectric conversion layer 10 is located, layers that constitute the light-shielding film 50 are typically arranged in the order of the metallic layer 52, the metallic layer 54, the metallic compound layer 53, the metallic layer 51, metallic layer 56, and the metallic compound layer 55. A typical combination of types of layers which constitute the light-shielding film 50 is an aluminum layer as the metallic layer 51, a tungsten layer as the metallic layer 52, titanium nitride layers as the metallic compound layers 53 and 55, and titanium layers as the metallic layers 54 and 56. A typical relationship among the thicknesses of layers constituting the light-shielding film 50 is expressed as "Td & Tf<Tc & Te<Tb<Ta". The relationship among the respective thicknesses may be "Tf<Td" and "Tc<Te". For example, the thickness Tc is 1 to 5 nm, the thickness Td is 1 to 10 nm, the thickness Tc is 10 to 50 nm, and the thickness Te is 10 to 50 nm.

A dielectric layer 43 is provided between the light-shielding film 50 and the photoelectric conversion layer 10. A metal oxide film 40 is provided between the light-shielding film 50 and the photoelectric conversion layer 10. The metal oxide film 40 is provided between the dielectric layer 43 and the photoelectric conversion layer 10. The metal oxide film 40 may include a metal oxide layer 41 and a metal oxide layer 42 located between the metal oxide layer 41 and the photoelectric conversion layer 10. The metal oxide layer 41 and the metal oxide layer 42 located between the metal oxide layer 41 and the photoelectric conversion layer 10 are provided between the light-shielding film 50 and the photoelectric conversion layer 10. A principal component of the dielectric layer 43 can be a silicon compound such as silicon oxide, silicon nitride, or silicon carbide. For example, a principal component of the metal oxide layer 41 is tantalum oxide or titanium oxide. For example, a principal component of the metal oxide layer 42 is aluminum oxide or hafnium oxide. A typical combination of types of layers constituting the dielectric body DL is a silicon oxide layer as the dielectric layer 43, a tantalum oxide layer as the metal oxide layer 41, and an aluminum oxide layer as the metal oxide layer 42. The dielectric layer 43 is located on the lower face of the light-shielding film 50. It is preferable that a distance between the metallic layer 52 and the dielectric layer 43 be less than the thickness Tb of the metallic layer 52. In other words, it is preferable that a light-shielding layer having a thickness greater than or equal to the thickness Tb of the metallic layer 52 should not be located between the metallic layer 52 and the dielectric layer 43. In the present exemplary embodiment, because a lower face of the light-shielding film 50 is configured of the metallic layer 52, the metallic layer 52 is in contact with the dielectric layer 43. Therefore, a distance between the metallic layer 52 and the dielectric layer 43 is zero. In a case where the light-shielding film 50 includes a light-shielding layer such as a metallic layer or a metallic compound layer (not illustrated) between the dielectric layer 43 and the metallic layer 52, a distance between the metallic layer 52 and the dielectric layer 43 corresponds to a thickness of the light-shielding layer between the dielectric layer 43 and the metallic layer 52. For example, a thickness Th is 5 to 20 nm, and a thickness Tg is 20 to 100 nm. For example, a thickness Tk is 5 to 20 nm, and a thickness Tg is 50 to 500 nm. A typical relationship among the thicknesses of the layers constituting the dielectric body DL is expressed as "Th<Tk<Tg". A typical relationship among the thicknesses of the layer constituting the light-shielding film 50 and the layers constituting the dielectric body DL is expressed as "Td<Th<Tk<Tg".

A connection portion 59 that is one portion of the face of the metallic layer 52 located on a side of the photoelectric conversion layer 10 is in contact with the photoelectric conversion layer 10. The photoelectric conversion layer 10 includes a predetermined conductivity-type semiconductor area 15, and the light-shielding film 50 and the photoelectric conversion layer 10 are electrically connected to each other through the connection portion 59 and the semiconductor area 15. The semiconductor area 15 and the light-shielding film 50 are maintained at a constant potential. The semiconductor area 15 is arranged in the peripheral area 3 different from the light-shielding pixel area 2. Further, the light-shielding wall 60 and the light-shielding film 50 are electrically connected to each other. The metal oxide layers 41 and 42, and the dielectric layer 43 have openings on the upper side of the semiconductor area 15, and a part of the metallic layer 52 is arranged inside the opening. This part of the metallic layer 52 arranged inside the opening includes the connection portion 59.

The light-shielding wall 60 provided on the upper side of the light-shielding film 50 in the light-receiving pixel area 1 is arranged to form a lattice (e.g., rectangular lattice). The light-shielding wall 60 has a lower face and an upper face. The optical structure 30 can include the light-shielding wall 60 provided on the upper side of the light-shielding film 50. The light-shielding wall 60 includes an opening AP. the light-shielding film 50 is located between the light-shielding wall 60 and the photoelectric conversion layer 10. In the light-receiving pixel area 1, the light-shielding wall 60 determines a light-transmission portion 36 consisting of the dielectric body DL, and a shape of the light-transmission portion 36 conforms to a shape of the opening AP. The light-transmission portions 36 may be provided in the light-receiving pixel area 1 and the light-shielding pixel area 2 at the same array pitch. In the light-receiving pixel area 1, the light-shielding wall 60 is provided to be in contact with and to overlap with the light-receiving pixel portion 57. In the light-shielding pixel area 2, the light-shielding wall 60 is provided to be in contact and overlap with the light-shielding pixel portion 58. Because the light-shielding film 50 is in contact with the light-shielding wall 60, light can be prevented from streaming through a portion between the light-shielding film 50 and the light-shielding wall 60. A concave portion may be formed on the upper face of the light-shielding film 50, so that a part of the light-shielding wall 60 can be arranged inside the concave portion. The light-shielding wall 60 is also arranged on a boundary between the photoelectric conversion portion 111 and the photoelectric conversion portion 112 adjacent thereto. Because the light-shielding wall 60 is provided thereon, light incident on the dielectric body DL (light-transmission portion 36) located on the upper side of the photoelectric conversion portion 112 can be prevented from being incident on the photoelectric conversion portion 111. The structures of both of the light-shielding walls 60 in the light-receiving pixel area 1 and the light-shielding pixel area 2 can be the same. The light-shielding wall 60 may or may not be provided in the peripheral area 3. A height H of the light-shielding wall 60 is preferably greater than the thickness T of the light-shielding film 50. The light-shielding wall 60 may include at least a metallic layer 61. By arranging the light-shielding wall 60, it is possible to suppress crosstalk of light occurring in the light-receiving pixels. The metallic layer 61 has a width Ww of 100 to 500 nm which is approximately conform to a width W of the light-shielding wall 60. The light-shielding wall 60 of the present exemplary embodiment includes a metallic compound layer 62 located between the metallic layer 61 and the dielectric body DL. A principal component of the metallic layer 61 can be tungsten or copper. A principle component of the metallic compound layer 62 can be titanium nitride or tantalum nitride. Although the metallic compound layer 62 can function as a barrier layer of the metallic layer 61, the metallic compound layer 62 may be omitted. The width W of the light-shielding wall 60 can be 100 to 500 nm. The height H of the light-shielding wall 60 can be 500 to 5000 nm. The light-shielding wall 60 may have a structure in which a plurality of light-shielding walls is vertically laminated. It is preferable that the width Ww of the metallic layer 61 of the light-shielding wall 60 be greater than the thickness Ta of the metallic layer 51 of the light-shielding film 50 (Ta<Ww). It is preferable that the width Ww of the metallic layer 61 of the light-shielding wall 60 be greater than the thickness Tb of the metallic layer 52 of the light-shielding film 50 (Tb<Ww). By increasing the width Ww of the metallic layer 61, the absorption rate of light incident on the metallic layer 61 can be improved. By making the width Ww of the metallic layer 61 greater than the thickness Ta of the metallic layer 51, the metallic layer 61 can provide sufficient light-shielding capability even if the extinction coefficient k of the material used for the metallic layer 61 is less than the extinction coefficient k of the material used for the metallic layer 51. Most of the light incident on the light-receiving pixel area 1 is incident on the photoelectric conversion layer 10 without being incident on the light-shielding wall 60. Therefore, the light-shielding wall 60 may have the light-shielding capability that is not as high as the light-shielding capability of the light-shielding film 50 on which most of light incident on the light-shielding pixel area 2 is incident. Herein, although both of the metallic compound layer 55 and the metallic compound layer 62 are located between the metallic layer 61 and the metallic layer 51, either one of the metallic compound layer 55 and the metallic compound layer 62 may be located between the metallic layer 61 and the metallic layer 51. For example, when a trench where the metallic layer 61 is provided is to be formed in the dielectric body DL, a slit may be formed in the metallic compound layer 55 (and the metallic layer 55) by removing the metallic compound layer 55. In this case, the metallic layer 61 or the metallic compound layer 62 provided inside the trench can be in contact with the metallic layer 51 or the metallic layer 56. The above-described relationship between the light-shielding wall 60 and the light-shielding film 50 can be satisfied even in a case where either one of the metallic layers 51 and 52 (e.g., metallic layer 52) of the light-shielding film 50 is omitted.

In the light-receiving pixel area 1, light incident on the photoelectric conversion apparatus APR is transmitted through the microlens ML and the green color filter CFG or the blue color filter CFB, and incident on the photoelectric conversion layer 10 through the light-transmission portion 36 or 35. The green color filter CFG and the blue color filter CFB are collectively called color filters, and a color filter array that includes the green color filter CFG and the blue color filter CFB also includes a red color filter (not illustrated). In the present exemplary embodiment, the microlens ML and the blue color filter CFB are also provided in the light-shielding pixel area 2. Although the microlens ML in the light-shielding pixel area 2 functions to bring a shape of the microlens ML in the light-receiving pixel area 1 into a favorable state, the microlens ML can be omitted from the light-shielding pixel area 2. Although the blue color filter CFB in the light-shielding pixel area 2 functions to reduce light incident on the light-shielding film 50, the blue color filter CFB can be omitted from the light-shielding pixel area 2. In the light-shielding pixel area 2, light incident on the photoelectric conversion apparatus APR is shielded or attenuated by the light-shielding film 50. Light that reaches the light-shielding film 50 can be blue light transmitted through the blue color filter CFB provided in the light-shielding pixel area 2.

An antireflection film (not illustrated) may be arranged between the light-shielding film 50 and the dielectric body DL. The antireflection film consists of silicon nitride or silicon oxynitride.

The light-shielding film 50 and the light-shielding wall 60 can be manufactured through the following method. First, metal oxide material films which constitute the metal oxide layers 41 and 42 are formed to cover the back surface F2, and a dielectric material film which constitutes the dielectric layer 43 is formed on the upper side of the metal oxide material films. Then, A connection opening is formed in the metal oxide material films and the dielectric material film at a position where the connection portion 59 is to be formed. Next, a light-shielding material film having a laminate structure including the metallic layers 51 and 52 is formed. At this time, the above-described connection opening is filled with the metallic layer 52 coming into the connection opening, so that the connection portion 59 is formed. Next, a plurality of openings OP is formed in the light-shielding material film through patterning, so that the light-shielding film 50 is formed. Subsequently, a dielectric material film including the dielectric layer 44 is formed to cover the light-shielding film 50. A part of the dielectric material film including the dielectric layer 44 comes into the opening OP. Then, a trench is formed in the dielectric material film on the light-shielding film 50. A portion surrounded by the trench becomes the light-transmission portion 36. A light-shielding material film such as a tungsten film is embedded in the trench through a method such as spattering. A portion of this light-shielding material film which is located on the upper side of the dielectric material film constituting the dielectric layer 44 is removed through the method such as chemical mechanical planarization (CMP). Through the above processing, the light-shielding wall 60 having the opening AP is formed. The height H of the light-shielding wall 60 can be controlled by the thickness of the dielectric material film which constitutes the dielectric layer 44.

For example, a semiconductor layer such as a monocrystalline silicon layer or a compound semiconductor layer can be used as the photoelectric conversion layer 10. A photodiode such as a positive-negative (P-N) junction type photodiode, a positive-intrinsic-negative (PIN) junction type photodiode, or an avalanche type photodiode, or a photogate can be used as the photoelectric conversion portion 11. The photoelectric conversion layer 10 according to the present exemplary embodiment includes a transistor for reading electric charges from the photoelectric conversion portion 11, and a gate electrode GE of the transistor is illustrated in FIG. 3. The read-out circuit may be arranged in a different semiconductor layer, and the semiconductor layer may be laminated with the photoelectric conversion layer 10. In this case, a transistor does not have to be provided in the photoelectric conversion layer 10. As another example, the photoelectric conversion apparatus APR may include a pixel electrode provided on a side of the front surface F1 of the photoelectric conversion layer 10 and an opposite electrode provided on a side of the back surface F2 of the photoelectric conversion layer 10. In this case, the photoelectric conversion layer 10 can be a photoelectric conversion film containing an organic material and/or an inorganic material. The photoelectric conversion film may be a quantum dot film. A portion located between the opposite electrode and the pixel electrode in the photoelectric conversion film functions as the photoelectric conversion portion 11.

The equipment EQP illustrated in FIG. 1B will be described in detail. The semiconductor apparatus (photoelectric conversion apparatus) APR includes a package PKG for storing the device DEV in addition to the device DEV. The package PKG includes a base member on which the device DEV is fixed, a cover member made of a material such as glass which faces the device DEV, and connection members such as a bonding wire and a bump for connecting a terminal provided in the base member to a terminal provided in the device DEV.

The equipment EQP further includes at least any one of an optical apparatus OPT, a control apparatus CTRL, a processing apparatus PRCS, a display apparatus DSPL, and a storage apparatus MMRY. For example, the optical apparatus OPT is a lens, a shutter, and an mirror, which forms an image on the semiconductor apparatus APR serving as a photoelectric conversion apparatus. The control apparatus CTRL is a semiconductor device such as an application specific integrated circuit (ASIC) which controls the semiconductor apparatus APR. The processing apparatus PRCS constitutes an analog frontend (AFE) or a digital frontend (DFE), and processes a signal output from the semiconductor apparatus APR. The processing apparatus PRCS is a semiconductor device such as a central processing unit (CPU) or an ASIC. The display apparatus DSPL is an electroluminescence (EL) display apparatus or a liquid crystal display apparatus which displays information (images) acquired by the semiconductor apparatus APR. The storage apparatus MMRY is a magnetic device or a semiconductor device which stores information (images) acquired by the semiconductor apparatus APR. The storage apparatus MMRY is a volatile memory such as a static random access memory (SRAM) or a dynamic random access memory (DRAM), or a non-volatile memory such as a flash memory or a hard disk drive. The mechanical apparatus MCHN includes a movable unit or a propulsion unit such as a motor or an engine. The equipment EQP displays a signal output from the semiconductor apparatus APR on the display apparatus DSPL and transmits the output signal to an external unit through a communication apparatus (not illustrated) included in the equipment EQP. Therefore, it is preferable that the equipment EQP further include the storage apparatus MMRY and the processing apparatus PRCS in addition to a storage circuit unit and a calculation circuit unit included in the semiconductor apparatus APR.

The equipment EQP illustrated in FIG. 1B can be an electronic equipment such as an information terminal (e.g., a smartphone or a wearable terminal) having an image-capturing function or a camera (e.g., an interchangeable lens camera, a compact camera, a video camera, or a monitoring camera). The mechanical apparatus MCHN included in the camera can drive components of the optical apparatus OPT to execute zooming, focusing, and shutter operations. Further, the equipment EQP can be a transportation equipment (moving body) such as a vehicle, a ship, or an air vehicle. The mechanical apparatus MCHN included in the transportation equipment can be used as a moving apparatus. The equipment EQP serving as a transportation equipment is suitable for transporting the semiconductor apparatus APR or assisting and/or automating an operation (driving operation) through an image-capturing function. The processing apparatus PRCS for assisting and/or automating the operation (driving operation) can execute processing for operating the mechanical apparatus MCHN serving as a moving apparatus based on the information acquired by the semiconductor apparatus APR. The equipment EQP can be a medical equipment such as an endoscope or a computed tomography (CT) scanning equipment, a measurement equipment such as a range-finding sensor, an analytical equipment such as an electronic microscope, or an office equipment such as a copying machine.

The semiconductor apparatus APR according to the present exemplary embodiment can provide high value to its designer, a manufacturer, a distributor, a purchaser, and/or a user. Therefore, the equipment EQP can be also upgraded if the semiconductor apparatus APR is mounted on the equipment EQP. Therefore, when the equipment EQP is to be manufactured and distributed, mounting the semiconductor apparatus APR of the present exemplary embodiment on the equipment EQP is advantageous for upgrading the equipment EQP.

The present invention is not limited to the above-described exemplary embodiments, and various modifications are possible. For example, an exemplary embodiment in which a part of a configuration according to any one of the above-described exemplary embodiments is added to or replaced with a configuration according to another exemplary embodiment is also included in the exemplary embodiments of the present invention. The content of disclosure of this specification includes not only the content described in this specification but also all the respects that can be grasped from this specification and drawings attached thereto. Further, the content of disclosure of this specification includes a complementary set of ideas described in the specification. In other words, if the specification discloses that "A is greater than B", for example, this can also be said that the specification discloses that "A is not greater than B" even if the disclosure "A is not greater than B" is omitted therefrom. This is because the disclosure "A is greater than B" is stated on the premise that the disclosure "A is not greater than B" is taken into consideration.

According to an aspect of the present invention, it is possible to provide a technique advantageous for improving an optical property of a photoelectric conversion apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-069428, filed Apr. 7, 2020, which is hereby incorporated by reference herein in its entirety.

What is claimed is:

1. A photoelectric conversion apparatus comprising:
   a photoelectric conversion layer;
   a light-shielding film configured to cover the photoelectric conversion layer;
   a light-receiving pixel area; and
   a light-shielding pixel area,
   wherein the light-shielding film includes a first metallic layer and a second metallic layer located between the first metallic layer and the photoelectric conversion layer,
   wherein a principal component of the first metallic layer is aluminum or silver,
   wherein a principal component of the second metallic layer is tungsten or tantalum,
   wherein, in the light-shielding pixel area, the photoelectric conversion layer is shielded from light with the light-shielding film, and
   wherein, in the light-receiving pixel area, the light-shielding film including the first metallic layer and the second metallic layer has a plurality of openings.

2. The photoelectric conversion apparatus according to claim 1, wherein a thickness of the first metallic layer is greater than a thickness of the second metallic layer.

3. The photoelectric conversion apparatus according to claim 1,
wherein the light-shielding film includes a first metallic compound layer provided between the first metallic layer and the second metallic layer.

4. The photoelectric conversion apparatus according to claim 3, wherein a thickness of the second metallic layer is greater than a thickness of the first metallic compound layer.

5. The photoelectric conversion apparatus according to claim 3, wherein a principal component of the first metallic compound layer is titanium nitride.

6. The photoelectric conversion apparatus according to claim 1,
wherein the light-shielding film includes a third metallic layer located between the first metallic layer and the second metallic layer,
wherein a principal component of the third metallic layer is tantalum or titanium, and
wherein the principal component of the second metallic layer is different from the principal component of the third metallic layer.

7. The photoelectric conversion apparatus according to claim 1, wherein the light-shielding film includes a second metallic compound layer provided on one side of the first metallic layer opposite to a side on which the photoelectric conversion layer is provided.

8. The photoelectric conversion apparatus according to claim 7, wherein a thickness of the first metallic layer is greater than a thickness of the second metallic compound layer.

9. The photoelectric conversion apparatus according to claim 1, wherein a distance between the light-shielding film and the photoelectric conversion layer is greater than a thickness of the second metallic layer.

10. The photoelectric conversion apparatus according to claim 1,
wherein a dielectric layer is provided between the second metallic layer and the photoelectric conversion layer, and
wherein a distance between the second metallic layer and the dielectric layer is less than a thickness of the second metallic layer.

11. The photoelectric conversion apparatus according to claim 1,
wherein a dielectric layer is provided between the light-shielding film and the photoelectric conversion layer, and
wherein a part of a face of the second metallic layer located on a side on which the photoelectric conversion layer is provided, is in contact with the photoelectric conversion layer.

12. The photoelectric conversion apparatus according to claim 1,
wherein a first metal oxide layer and a second metal oxide layer located between the first metal oxide layer and the photoelectric conversion layer are provided between the light-shielding film and the photoelectric conversion layer.

13. The photoelectric conversion apparatus according to claim 1, wherein a thickness of the first metallic layer is 100 to 300 nm, and a thickness of the second metallic layer is 50 to 150 nm.

14. The photoelectric conversion apparatus according to claim 1, further comprising a wiring structure provided on one side of the photoelectric conversion layer opposite to a side on which the light-shielding film is provided.

15. An equipment comprising:
the photoelectric conversion apparatus according to claim 1; and
a processing apparatus electrically connected to the photoelectric conversion apparatus, and configured to process a signal output from the photoelectric conversion apparatus.

16. The photoelectric conversion apparatus according to claim 1, further comprising a semiconductor area including a transistor, a first face on which light is incident and a dielectric layer provided between the light shielding layer and the photoelectric conversion layer,
wherein the light shielding layer has a second face which is in contact with the dielectric layer, and
wherein a distance between the light-shielding layer and the photoelectric conversion layer is a distance from the first face to the second face.

17. The photoelectric conversion apparatus according to claim 1,
wherein a light-shielding wall is provided on an upper side of the light-shielding film in the light-receiving pixel area, and
wherein a height of the light-shielding wall is greater than a thickness of the light-shielding film.

18. The photoelectric conversion apparatus according to claim 1, further comprising a wiring layer and a semiconductor area,
wherein the semiconductor area includes the photoelectric conversion layer, and has a first face and a second face, and
wherein the first face is configured to receive light and is located between the photoelectric conversion layer and the light shielding layer, and the second face is located between the wiring layer and the first face.

19. The photoelectric conversion apparatus according to claim 1,
wherein the following conditional expression is satisfied:

$$((Na-1)^2+Ka^2)/((Na+1)^2+Ka^2)>((Nb-1)^2+Kb^2)/((Nb+1)^2+Kb^2) \text{ and } Kb \times Tb \geq 0.183 \times \lambda b,$$

where Na is a refractive index of the first metallic layer, Ka is an extinction coefficient of the first metallic layer, Nb is a refractive index of the second metallic layer, Kb is an extinction coefficient of the second metallic layer, Tb (nm) is a thickness of the second metallic layer, and λb (nm) is a wavelength of one of green, blue and red color light.

20. The photoelectric conversion apparatus according to claim 19
wherein a distance between the light-shielding film and the photoelectric conversion layer is less than a thickness of the light-shielding film.

21. The photoelectric conversion apparatus according to claim 19,
wherein the wavelength of blue color light includes 450 nm,
wherein the wavelength of green color light includes 550 nm, and
wherein the wavelength of red color light includes 630 nm.

22. A photoelectric conversion apparatus comprising:
a photoelectric conversion layer; and
a light-shielding film configured to cover the photoelectric conversion layer, wherein the light-shielding film includes a first metallic layer, a second metallic layer located between the first metallic layer and the photoelectric conversion layer, and a third metallic layer located between the first metallic layer and the second metallic layer, wherein a principal component of the first metallic layer is aluminum or silver, wherein a principal component of the second metallic layer is tungsten or tantalum, wherein a principal component of the third metallic layer is tantalum or titanium, and wherein the principal component of the second metallic layer is different from the principal component of the third metallic layer.

23. The photoelectric conversion apparatus according to claim 22, wherein a thickness of the first metallic layer is greater than a thickness of the second metallic layer.

24. The photoelectric conversion apparatus according to claim 22, wherein the light-shielding film includes a first metallic compound layer provided between the first metallic layer and the third metallic layer, and wherein the first metallic compound layer is a titanium nitride layer or a tantalum nitride layer.

25. The photoelectric conversion apparatus according to claim 22, further comprising:

a light-receiving pixel area; and a light-shielding pixel area, wherein, in the light-shielding pixel area, the photoelectric conversion layer is shielded from light with the light-shielding film, and wherein, in the light-receiving pixel area, the light-shielding film including the first metallic layer, the second metallic layer and the third metallic layer has a plurality of openings.

26. The photoelectric conversion apparatus according to claim 25, wherein a light-shielding wall is provided on an upper side of the light-shielding film in the light-receiving pixel area, and wherein a height of the light-shielding wall is greater than a thickness of the light-shielding film.

27. The photoelectric conversion apparatus according to claim 26, wherein a principal component of the light-shielding wall is tungsten.

28. An equipment comprising:

the photoelectric conversion apparatus according to claim 22; and a processing apparatus electrically connected to the photoelectric conversion apparatus, and configured to process a signal output from the photoelectric conversion apparatus.

29. The photoelectric conversion apparatus according to claim 22, further comprising a wiring layer and a semiconductor area, wherein the semiconductor area includes the photoelectric conversion layer, and has a first face and a second face, and wherein the first face is configured to receive light and is located between the photoelectric conversion layer and the light shielding layer, and the second face is located between the wiring layer and the first face.

30. The photoelectric conversion apparatus according to claim 22, wherein the following conditional expression is satisfied:

$$((Na-1)^2+Ka^2)/((Na+1)^2+Ka^2) > ((Nb-1)^2+Kb^2)/((Nb+1)^2+Kb^2) \text{ and } Kb \times Tb \geq 0.183 \times \lambda b,$$

where Na is a refractive index of the first metallic layer, Ka is an extinction coefficient of the first metallic layer, Nb is a refractive index of the second metallic layer, Kb is an extinction coefficient of the second metallic layer, Tb (nm) is a thickness of the second metallic layer, and λb (nm) is a wavelength of one of green, blue and red color light.

31. The photoelectric conversion apparatus according to claim 30 wherein a distance between the light-shielding film and the photoelectric conversion layer is less than a thickness of the light-shielding film.

32. The photoelectric conversion apparatus according to claim 30, wherein the wavelength of blue color light includes 450 nm, wherein the wavelength of green color light includes 550 nm, and wherein the wavelength of red color light includes 630 nm.

* * * * *